(12) United States Patent
Sridhar et al.

(10) Patent No.: US 12,224,160 B2
(45) Date of Patent: Feb. 11, 2025

(54) TOPOGRAPHIC SELECTIVE DEPOSITION

(71) Applicant: Tokyo Electron Limited, Tokyo (JP)

(72) Inventors: Shyam Sridhar, Austin, TX (US); Peter Lowell George Ventzek, Austin, TX (US); Alok Ranjan, Austin, TX (US)

(73) Assignee: Tokyo Electron Limited, Tokyo (JP)

(*) Notice: Subject to any disclaimer, the term of this patent is extended or adjusted under 35 U.S.C. 154(b) by 0 days.

(21) Appl. No.: 18/322,362

(22) Filed: May 23, 2023

(65) Prior Publication Data

US 2024/0395507 A1 Nov. 28, 2024

(51) Int. Cl.
*H01J 37/32* (2006.01)

(52) U.S. Cl.
CPC .. *H01J 37/32449* (2013.01); *H01J 37/32816* (2013.01); *H01J 2237/327* (2013.01); *H01J 2237/332* (2013.01); *H01J 2237/334* (2013.01)

(58) Field of Classification Search
CPC ................................................ H01J 37/32449
See application file for complete search history.

(56) References Cited

U.S. PATENT DOCUMENTS

| | | |
|---|---|---|
| 7,074,714 B2 | 7/2006 | Chiang |
| 8,382,999 B2 | 2/2013 | Agarwal et al. |
| 10,319,583 B2 | 6/2019 | Li |
| 10,366,902 B2 | 7/2019 | Ranjan et al. |
| 10,395,919 B2 | 8/2019 | Masaru |
| 10,410,858 B2 | 9/2019 | Tapily |
| 10,763,108 B2 | 9/2020 | Hausmann |
| 11,342,195 B1* | 5/2022 | Han ............... H01L 21/02274 |
| 11,495,470 B1 | 11/2022 | Zhou et al. |
| 2002/0039843 A1 | 4/2002 | Ikeda |
| 2006/0134917 A1 | 6/2006 | Huang |

(Continued)

FOREIGN PATENT DOCUMENTS

JP H10261713 A 9/1998

OTHER PUBLICATIONS

Huang, Shuo et al. "Plasma Etching of High Aspect Ratio Features in SiO2 Using AR/C4/F8/O2 Mixtures: A Computational Investigation." Journal of Vacuum Science & Technology A, vol. 37, No. 3, 2019, Published Apr. 17, 2019, p. 031304., https://doi.org/10.1116/1.5090606, 26 pages.

(Continued)

*Primary Examiner* — Austin Murata
(74) *Attorney, Agent, or Firm* — Slater Matsil, LLP (57) ABSTRACT

A method of processing a substrate that includes: flowing a gas including a fluorocarbon to a plasma processing chamber; sustaining a plasma generated from the gas; depositing a carbonaceous layer over the substrate by exposing the substrate to the plasma, the substrate having a recess having an aspect ratio between 10:1 and 100:1, the depositing including a pulsed plasma process including: during a first time duration, setting a source power (SP) at a first SP level and a bias power (BP) at a first BP level, where the plasma includes fluorocarbon ions polymerizing on a bottom surface to form the carbonaceous layer, and during a second time duration, setting the SP at a second SP level higher than the first SP level and the BP at a second BP level lower than the first BP level, where the plasma includes fluorine radicals trimming the carbonaceous layer.

20 Claims, 9 Drawing Sheets

(56) References Cited

U.S. PATENT DOCUMENTS

| | | | |
|---|---|---|---|
| 2007/0123031 | A1 | 5/2007 | Isogai |
| 2017/0243757 | A1* | 8/2017 | Ranjan .............. H01L 21/02252 |
| 2017/0263438 | A1 | 9/2017 | Li |
| 2018/0286707 | A1 | 10/2018 | Hudson et al. |
| 2020/0035496 | A1 | 1/2020 | Kakimoto |
| 2021/0098234 | A1 | 4/2021 | Katsunuma |
| 2022/0051902 | A1 | 2/2022 | Tanaka |
| 2022/0059358 | A1* | 2/2022 | Ventzek ............ H01J 37/32183 |
| 2022/0310357 | A1* | 9/2022 | Ventzek ............ H01J 37/32174 |

OTHER PUBLICATIONS

International Search Report and Written Opinion, International Application No. PCT/US2024/024980, mailed Aug. 14, 2024, 11 pages.

Kim, Woo-Hee et al. "A Process for Topographically Selective Deposition on 3D Nanostructures by Ion Implantation," ACS Nano, vol. 10, No. 4, 2016, pp. 4451-4458., https://doi.org/10.1021/acsnano.6b00094, published Mar. 7, 2026.

Kokkoris, George et al. "A Global Model for C4F8 Plasmas Coupling Gas Phase and Wall Surface Reaction Kinetics," Journal of Physics D: Applied Physics, vol. 41, No. 19, 2008, published Sep. 18, 2008, https://doi.org/10.1088/0022-3727/41/19/195211, 13 pages.

Manstetten, Paul et al. "Framework to Model Neutral Particle Flux in Convex High Aspect Ratio Structures Using One-Dimensional Radiosity," Solid-State Electronics, vol. 128, 2017, pp. 141-147, Dec. 23, 2016, https://doi.org/10.1016/j.sse.2016.10.029, 7 pages.

Yeom, Junghoon et al., "Maximum Achievable Aspect Ratio in Deep Reactive Ion Etching of Silicon Due to Aspect Ratio Dependent Transport and the Microloading Effect," Journal of Vacuum Science & Technology B: Microelectronics and Nanometer Structures, vol. 23, No. 6, 2005, p. 2319, published Oct. 31, 2005, https://doi.org/10.1116/1.2101678, 12 pages.

* cited by examiner

TOPOGRAPHIC SELECTIVE DEPOSITION

TECHNICAL FIELD

The present invention relates generally to methods of processing a substrate, and, in particular embodiments, to topographic selective deposition.

BACKGROUND

Generally, a semiconductor device, such as an integrated circuit (IC) is fabricated by sequentially depositing and patterning layers of dielectric, conductive, and semiconductor materials over a substrate to form a network of electronic components and interconnect elements (e.g., transistors, resistors, capacitors, metal lines, contacts, and vias) integrated in a monolithic structure. Many of the processing steps used to form the constituent structures of semiconductor devices is performed using plasma processes.

The semiconductor industry has repeatedly reduced the minimum feature sizes in semiconductor devices to a few nanometers to increase the packing density of components. Accordingly, the semiconductor industry increasingly demands plasma-processing technology to provide processes for patterning features with accuracy, precision, and profile control, often at atomic scale dimensions. These requirements are particularly stringent for three-dimensional (3D) structures, for example, a fin field-effect transistor (FinFET) wherein the gate electrode wraps around three sides of closely-spaced, narrow and long fin-shaped semiconductor features formed by etching trenches into the semiconductor substrate. Meeting this challenge along with the uniformity and repeatability needed for high volume IC manufacturing requires further innovations of plasma processing technology.

SUMMARY

In accordance with an embodiment of the present invention, a method of processing a substrate that includes: flowing a gas including a fluorocarbon to a plasma processing chamber; sustaining a plasma generated from the gas in the plasma processing chamber; depositing a carbonaceous layer over the substrate by exposing the substrate to the plasma, the substrate including top and bottom surfaces, the bottom surface being at a bottom of a recess of the substrate, the recess having an aspect ratio between 10:1 and 100:1, the carbonaceous layer being deposited on the bottom surface, the depositing including a pulsed plasma process including a plurality of pulse cycles, each pulse cycle of the pulsed plasma process including: during a first time duration, setting a source power (SP) at a first SP level and a bias power (BP) at a first BP level, where the plasma during the first time includes fluorocarbon ions, the fluorocarbon ions polymerizing on the bottom surface to form the carbonaceous layer, and during a second time duration, setting the SP at a second SP level higher than the first SP level and the BP at a second BP level lower than the first BP level, where the plasma during the second time duration includes fluorine radicals, the fluorine radicals trimming the carbonaceous layer.

In accordance with an embodiment of the present invention, a method of processing a substrate that includes: flowing a gas including a fluorocarbon to a plasma processing chamber; sustaining a plasma generated from the gas in the plasma processing chamber; depositing a carbonaceous layer over the substrate by exposing the substrate to the plasma, the substrate including top and bottom surfaces, the bottom surface being at a bottom of a recess of the substrate, the recess having an aspect ratio between 10:1 and 100:1, the carbonaceous layer being deposited on the bottom surface, the depositing including performing a pulsed plasma process with a pulse pattern, the pulse pattern including: during a plasma-on phase, setting a source power (SP) at a first SP level, and during an afterglow phase, setting the SP at zero relative to ground potential and a bias power (BP) at a first BP level, where the first SP level is selected to produce fluorocarbon ions and radical species, where the first BP level is selected to increase a thickness of a plasma sheath of the plasma during the afterglow phase relative to that during the plasma-on phase, and cause collisions and charge exchange between the fluorocarbon ions and radical species to form fast neutrals species from the fluorocarbon ions, the fast neutrals species polymerizing on the bottom surface to form the carbonaceous layer.

In accordance with an embodiment of the present invention, a method of processing a substrate that includes: flowing a gas including a fluorocarbon to a plasma processing chamber; sustaining a plasma generated from the gas in the plasma processing chamber; and etching the substrate to form a recess having an aspect ratio between 10:1 and 100:1 using a patterned etch mask disposed over the substrate, the etching including exposing the substrate to the plasma, the exposing including cyclically repeating an etch phase and a passivation phase, where, during the passivation phase, a carbonaceous layer is deposited over a top surface of the patterned etch mask, and where the passivation phase includes during a first time duration, setting a source power (SP) at a first SP level and a bias power (BP) at a first BP level, the first SP level being higher than the first BP level, and during a second time duration, setting the SP at a second SP level lower than the first SP level and the BP at a second BP level higher than the first BP level, the second BP level being higher than the second SP level.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1A-1D illustrate cross-sectional views of a substrate at various stages of topographic selective deposition in accordance with various embodiments, wherein FIG. 1A illustrates the incoming substrate having a high aspect ratio (HAR) feature, FIG. 1B illustrates the substrate after a deposition phase, FIG. 1C illustrates the substrate after a trim phase, and FIG. 1D illustrates the substrate after multiple deposition and trim phases;

FIGS. 2A-2D illustrate cross-sectional views of a substrate at various stages of a HAR etch process comprising topographic selective deposition in accordance with alternate embodiments, wherein FIG. 2A illustrates the incoming substrate having a patterned hardmask layer, FIG. 2B illustrates the substrate after an initial etch, FIG. 2C illustrates the substrate after a topographic selective deposition, and FIG. 2D illustrates the substrate after another etch step;

FIGS. 4A-4B illustrate timing diagrams of plasma pulsing for ion-assisted topographic selective deposition in accordance with various embodiments, and FIG. 4A illustrates an embodiment with four phases, and FIG. 4B illustrates another embodiment with three phases;

FIGS. 5A-5B illustrate topographic selective deposition driven by fast neutral species in accordance with another embodiment, wherein FIG. 5A illustrates formation of the fast neutral species, and FIG. 5B illustrates a plasma sheath comprising the fast neutral species;

FIGS. 6A-6B illustrate fast neutral-assisted topographic selective deposition in accordance with various embodiments, wherein FIG. 6A illustrates a timing diagram of plasma pulsing, and FIG. 6B illustrates profiles of ion and radical density corresponding to the timing diagram in FIG. 6A; and FIGS. 7A-7C illustrate process flow charts of methods of topographic selective deposition in accordance with various embodiments, wherein FIG. 7A illustrates an embodiment, FIG. 7B illustrates another embodiment, and FIG. 7C illustrates yet another embodiment.

DETAILED DESCRIPTION OF ILLUSTRATIVE EMBODIMENTS

This application relates to a method of processing a substrate, more particularly to topographic selective deposition in an etching or deposition process for high aspect ratio (HAR) features. In semiconductor device fabrication where HAR features are formed, a deposition of a carbonaceous layer from a gas (e.g., fluorocarbon) during an etch process may be used to improve mask etch selectivity. However, typical plasma conditions may often result in heavy deposition on the top surface and upper sidewall portions of the mask, which can narrow the critical dimension (CD) of the opening and ultimately cause feature clogging. This clogging issue can worsen as the HAR increases. To overcome this issue, a new plasma processing scheme that can achieve more anisotropic and directional deposition may be desired.

Embodiments of the present application disclose methods of pulsed plasma process comprising topographic selective deposition. In this disclosure, topographic selective deposition refers to area selective deposition that may selectively proceed on surfaces with certain topographies over others, for example, preferentially on horizontal surfaces over vertical surfaces. Plasma parameters for the pulsed plasma process may be tuned such that the deposition precursor may comprise ion or fast neutral species, which are provided with sufficient kinetic energy directed to the target substrate. The inventors of this application identified that these species (i.e., ions or fast neutral species) may offer better directionality of deposition precursors compared to non-directional radical species, which is more prevalent in conventional plasma deposition conditions. With the increased directionality, a flux of the deposition precursors can be maintained relatively unchanged vertically throughout the HAR feature. This ion-assisted or fast neutral-assisted deposition therefore may achieve selective deposition on the top and bottom surfaces of the HAR feature while reducing undesired sidewall deposition. The pulsed plasma process may further comprise a trim phase to further improve the anisotropy of the deposition.

The methods of topographic selective deposition described herein may be applied to various semiconductor device fabrication that requires HAR features, for example, high capacity three-dimensional (3D) memory devices, such as a 3D-NAND (or vertical-NAND), 3D-NOR, or dynamic random access memory (DRAM) device. Features with aspect ratio (ratio of height of the feature to the width of the feature) higher than 50:1 are generally considered to be high aspect ratio features, and in some cases fabricating a higher aspect ratio such as 100:1 may be desired for advanced 3D semiconductor devices.

In the following, steps of topographic selective deposition in HAR features are described referring to FIGS. 1A-1D in accordance with various embodiments. Example applications of the method in a plasma etch process to form HAR features is described referring to FIGS. 2A-2D and 3. Details of plasma conditions useful for topographic selective deposition are then described. First, the ion-assisted deposition method is described referring to FIGS. 4A-4B. Second, the fast neutral-assisted deposition method is described referring to FIGS. 5A-5B and 6A-6B. Example process flow diagrams are illustrated in FIG. 7A-7C. All figures in this disclosure are drawn for illustration purpose only and not to scale, including the aspect ratios of features.

FIGS. 1A-1D illustrate cross-sectional views of a substrate 100 at various stages of topographic selective deposition in accordance with various embodiments. In various embodiments, the topographic selective deposition may be performed as a pulsed plasma process comprising a deposition phase (FIG. 1B) and a trim phase (FIG. 1C) enabled by plasma pulsing as further described below.

Figure 1A:
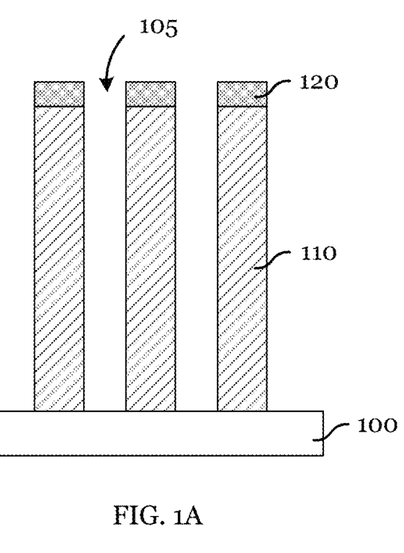

FIG. 1A illustrates a cross-sectional view of an incoming substrate 100. In various embodiments, the substrate 100 may be a part of, or include, a semiconductor device, and may have undergone a number of steps of processing following, for example, a conventional process. The substrate 100 accordingly may comprise layers of semiconductors useful in various microelectronics. For example, the semiconductor structure may comprise the substrate 100 in which various device regions are formed.

In one or more embodiments, the substrate 100 may be a silicon wafer, or a silicon-on-insulator (SOI) wafer. In certain embodiments, the substrate 100 may comprise a silicon germanium wafer, silicon carbide wafer, gallium arsenide wafer, gallium nitride wafer and other compound semiconductors. In other embodiments, the substrate 100 comprises heterogeneous layers such as silicon germanium on silicon, gallium nitride on silicon, silicon carbon on silicon, as well layers of silicon on a silicon or SOI substrate. In various embodiments, the substrate 100 is patterned or embedded in other components of the semiconductor device.

As illustrated in FIG. 1A, a material layer 110 may be formed over the substrate 100. In various embodiments, as a result of prior processes (e.g., reactive ion etching), the material layer 110 is patterned into one or more high aspect ratio (HAR) features. In FIG. 1A, recesses 105 have been formed. In certain embodiments, the HAR feature formed in the material layer 110 may be used for a contact hole, slit, or other suitable structures comprising a recess. In various embodiments, the HAR feature comprising the recesses 105 may have an aspect ratio between 10:1 and 100:1.

In one embodiment, the material layer 110 may comprise silicon oxide, but in other embodiments, it may comprise other materials such as silicon oxycarbide, silicon nitride, and silicon oxynitride. Further, the material layer 110 may be a layer stack made of multiple layers. The material layer 110 may be deposited using an appropriate technique such as vapor deposition including chemical vapor deposition (CVD), physical vapor deposition (PVD), atomic layer deposition (ALD), as well as other plasma processes such as plasma enhanced CVD (PECVD) and other processes. In one embodiment, the material layer 110 has a thickness between 1 μm and 10 μm.

Still referring to FIG. 1A, a patterned hardmask layer 120 may be over the material layer 110. In various embodiments, the patterned hardmask layer 120 may comprise amorphous carbon layer (ACL) or other carbon-based mask materials. The patterned hardmask layer 120 may have been used for patterning the material layer 110 and forming the HAR features (i.e., the recesses 105 in FIG. 1A). In various embodiments, the patterned hardmask layer 120 may be formed by first depositing a hardmask layer over the material layer 110 using, for example, an appropriate spin-coating technique or a vapor deposition technique such as chemical vapor deposition (CVD), physical vapor deposition (PVD), atomic layer deposition (ALD), as well as other plasma processes such as plasma enhanced CVD (PECVD) and other processes. The deposited hardmask layer may then be patterned using a lithography process and an anisotropic etch process.

The patterned hardmask layer 120 and/or the material layer 110 may be collectively considered as a part of the substrate 100. Further, the substrate 100 may also comprise other layers. For example, for the purpose of patterning the hardmask layer, a tri-layer structure comprising a photoresist layer, SiON layer, and optical planarization layer (OPL) may be present.

Figure 1B:
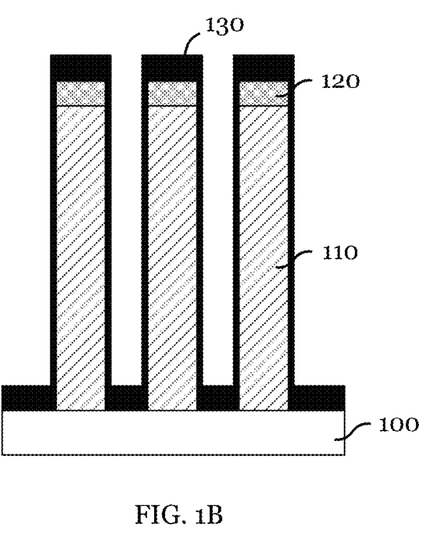

FIG. 1B illustrates a cross-sectional view of the substrate 100 after a deposition phase.

In FIG. 1B, for the deposition phase, the substrate 100 may be exposed to a plasma comprising deposition precursors, and a carbonaceous layer 130 may be formed. In various embodiments, a process gas may comprise one or more fluorocarbons or hydrofluorocarbons. Examples of fluorocarbon may include but are not limited to hexafluorobutadiene ($C_4F_6$), hexafluoro-2-butyne ($C_4F_6$), hexafluorocyclobutene ($C_4F_6$), octafluorocyclobutane ($C_4F_8$), octafluoro-2-butene ($C_4F_8$), hexafluoropropylene ($C_3F_6$), octafluoropropane ($C_3F_8$), perfluorobutane ($C_4F_{10}$), perflenapent ($C_5F_{12}$), carbon tetrafluoride ($CF_4$), and fluoroform ($CHF_3$).

In certain embodiments, other gases such as a noble gas and/or a balancing agent may also be added. The addition of the balancing agent such as dioxygen ($O_2$) may be beneficial in controlling the amount of deposition. For example, dissociated oxygen species may react with the surface species and partially suppress polymerization on surface, particularly near the top openings of the recesses 105. As a result, clogging may be prevented while the deposition still occurs. The noble gas may comprise helium (He), neon (Ne), argon (Ar), krypton (Kr), xenon (Xe), or radon (Rn). For example, in one embodiment, argon (Ar) and dioxygen ($O_2$) may be included as the noble gas and the balancing agent, respectively.

The plasma conditions may be adjusted to generate a sufficient amount of ions, fast neutrals, or both that can be the deposition precursors. Further, these species may be provided with kinetic energy from a bias power applied to the plasma, and thereby their flux may be maintained relatively unchanged throughout the recesses 105. As a result, the deposition precursors may advantageously be delivered to the bottom of the recesses 105 and the carbonaceous layer 130 covers both the top surface of the patterned hardmask layer 120 and the bottom surface in the recesses 105 (i.e., on the surface of the substrate 100 in FIG. 1B). Plasma parameters and pulsing schemes in various embodiments to achieve such conditions will be described in detail below referring to FIGS. 4A-4B, 5A-5B and 6A-6B.

As illustrated in FIG. 1B, the carbonaceous layer 130 may also cover sidewalls of the recesses 105, but to a lesser extent compared to conventional methods due to anisotropic nature of the deposition. In various embodiments, the directionality of the deposition precursors may minimize the deposition on the sidewall while making the deposition at the bottom surface possible. This selective deposition can therefore avoid the clogging of the recesses 105.

Figure 1C:
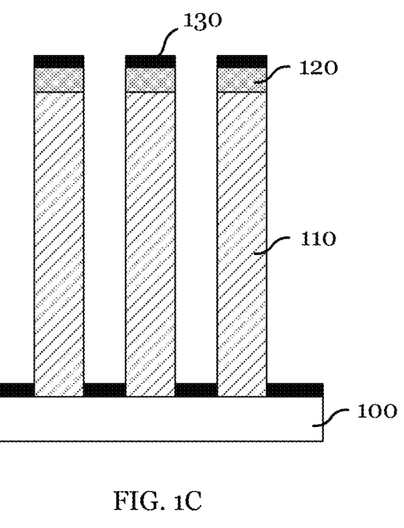

FIG. 1C illustrates a cross-sectional view of the substrate 100 after a trim phase.

In certain embodiments, after the deposition phase, the trim phase may be enabled by adjusting the plasma conditions, for example using plasma pulsing scheme, to enable trimming of the carbonaceous layer 130. In one or more embodiments, the trimming by fluorine-containing radicals and ion bombardment may be enabled by increasing the source power and reducing the bias power. The trimming of the carbonaceous layer 130 may proceed relatively isotropically, thereby further improving the area selectivity of topographic selective deposition (i.e., anisotropy) of the pulsed plasma process. As illustrated in FIG. 1C, while the top and bottom portions of the carbonaceous layer 130 (horizontal portions) may be trimmed to be thinner, the sidewall portions of the carbonaceous layer 130 (vertical portions) may be completely removed during the trim phase. Accordingly, the trim phase may be beneficial in adjusting the thickness of the horizontal portions as well as removing the vertical portions. Plasma parameters and pulsing schemes in various embodiments to achieve such conditions will be described in detail below referring to FIGS. 4A-4B, 5A-5B and 6A-6B.

Figure 1D:
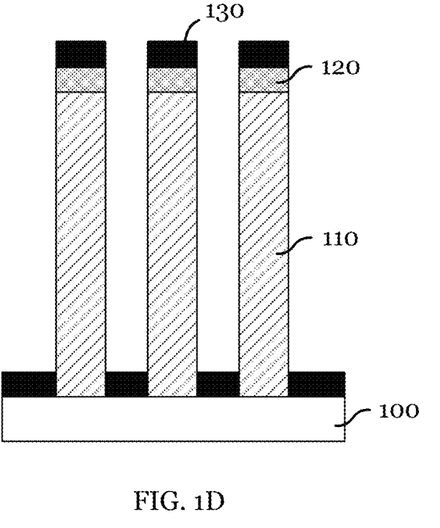

FIG. 1D illustrates a cross-sectional view of the substrate 100 after multiple deposition and trim phases.

In various embodiments, the pulsed plasma process may continuously alternating deposition and trip phases to achieve a desired thickness of the carbonaceous layer 130 at the top and bottom surfaces (i.e., over the patterned hardmask layer 130 and the exposed surface of the substrate 100 in FIG. 1D). In certain embodiments, during the pulsed plasma process, the plasma pulsing scheme may change its pattern, for example, such that one or more of the deposition or trim phases may be skipped or prolonged depending on the progress of the topographic selective deposition.

The methods of topographic selective deposition as described above may be applied for various semiconductor device fabrication processes where selective etching or deposition in HAR features may be required. For example, the carbonaceous layer 130 selectively deposited as illustrated in FIGS. 1A-1D may advantageously be used as an additional etch mask in an etch process as described below referring to FIGS. 2A-2D.

Figure 2A:
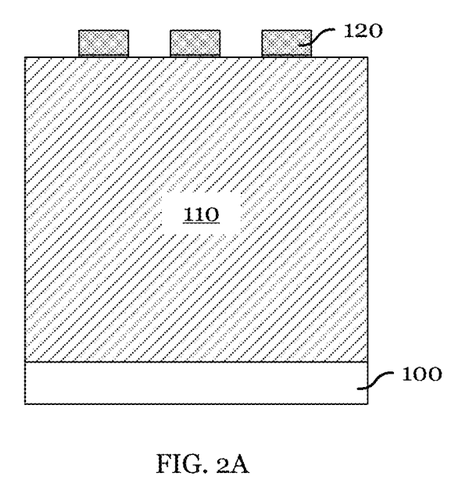
Figure 2B:
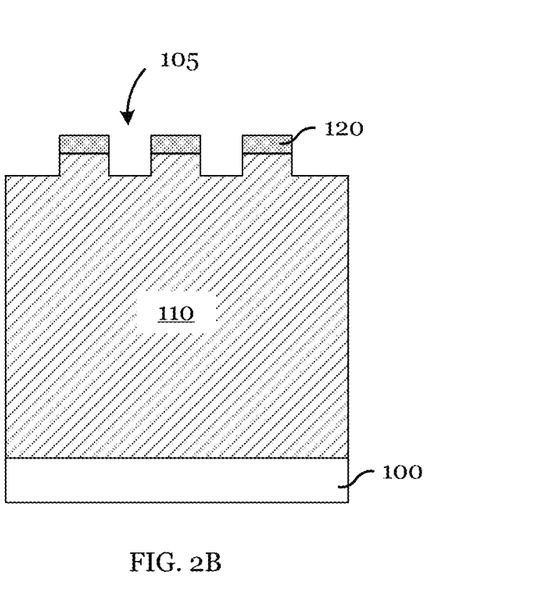
Figure 2C:
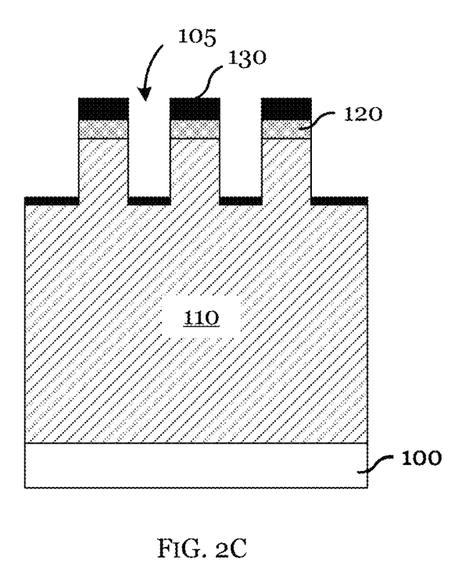
Figure 2D:
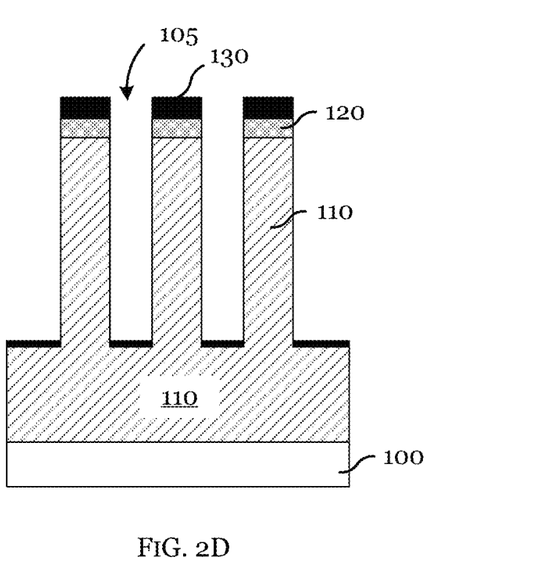

FIGS. 2A-2D illustrate cross-sectional views of a substrate 100 at various stages of a HAR etch process comprising topographic selective deposition in accordance with alternate embodiments. A plasma etch process may comprise steps of an initial etch (FIG. 2B), topographic selective deposition with deposition and trim phases (FIG. 2C), and subsequent etch step (FIG. 2D).

FIG. 2A illustrates a cross-sectional view of an incoming substrate 100 comprising a material layer 110 and a patterned hardmask layer 120. The features of the substrate 100 in FIG. 2A may be identical to those in FIG. 1A except the absence of recesses, and therefore will not be repeated. The plasma etch process may be performed to form HAR features while the topographic selective deposition is incorporated to provide an additional etch mask over the hardmask.

FIG. 2B illustrates a cross-sectional view of the substrate 100 after an initial etch.

In various embodiments, the plasma etch process may use halogen-based etch chemistry. Accordingly, an etch process gas may comprise one or more fluorocarbons or hydrofluorocarbons. The same examples of fluorocarbons and hydrofluorocarbons previously described referring to FIG. 2B may be used. Using the fluorocarbon-based chemistry, the plasma for the plasma etch process can advantageously generate two important species: (i) etchants for removing the target material (e.g., silicon oxide of the material layer 110) and (ii) polymerizing species (radicals, ions, etc.) to form a polymeric deposition, which may be beneficial as a passivation layer. In various embodiments, gas selection and process parameters may be determined to obtain a desired balance between the two. Further, for the plasma etch process to form HAR features with straight and uniform recesses 105, these parameters may have to be dynamically controlled throughout the process to adjust this balance as the etch process proceeds. In FIG. 2B, the initial etch may be tuned for an etching regime to start forming recesses 105.

FIG. 2C illustrates a cross-sectional view of the substrate 100 after a topographic selective deposition.

In FIG. 2C, the topographic selective deposition comprising deposition and trim phases, as described referring to FIGS. 1B and 1C, may be performed to selectively form a carbonaceous layer 130 over the top surface of the patterned hardmask layer 120 as well as the bottom surface of the recesses 105. As described above, the carbonaceous layer 130 may be selectively formed on the horizontal portions of the surface, thus preventing clogging issues by the deposition.

FIG. 2D illustrates a cross-sectional view of the substrate 100 after another etch step.

After the topographic selective deposition, the plasma etch process may proceed with a subsequent etch step to extend the recesses 105. The carbonaceous layer deposited on top of the patterned hardmask layer 130 may serve as an additional etch mask during this etch step, improving the mask etch selectivity. These steps of topographic selective deposition and subsequent etch step may be cyclically repeated as a cyclic plasma etch process until the recesses 105 reaches to a target depth. In certain embodiments, although not illustrated, the cyclic plasma etch process may be continued to expose the surface of the substrate 100 at the bottom of the recesses 105.

Figure 3:
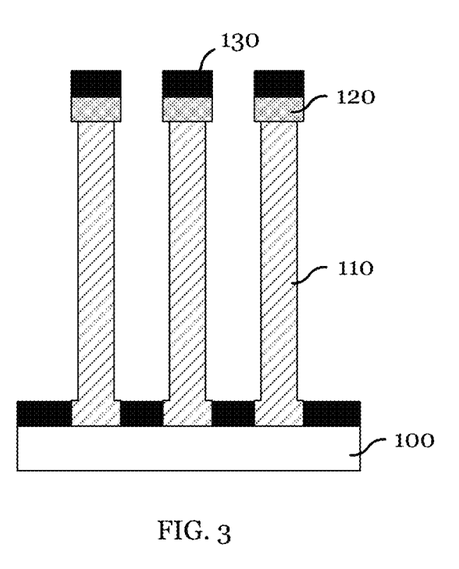
FIG. 3 illustrates a cross-sectional views of a substrate after topographic selective deposition and lateral etch in accordance with another embodiment.

FIG. 3 illustrates a cross-sectional views of a substrate 100 after topographic selective deposition and lateral etch in accordance with another embodiment.

In another embodiment, the topographic selective deposition may be followed by a lateral etch to adjust CD of the HAR features. In FIG. 3, the substrate 100 with HAR features with the carbonaceous layer 130 of FIG. 1D may be further etched for the material layer 110, but selectively to the carbonaceous layer 130. In one embodiment, the etch process gas for the lateral etch may use the same fluorocarbon used for forming the HAR features, but in another embodiment, a different gas such as Cl-based etch gas may be used.

In various embodiments, the topographic selective deposition may be enabled by the ion-assisted deposition method. The deposition phase may be realized by providing a suitable plasma condition where ion species can enhance the deposition rate and its directionality. Generally, in a plasma generated from a process gas comprising fluorocarbon, the deposition of a polymeric species on surface can occur from radical/ion fragments. Due to isotropic nature of radicals and its consumption at surfaces, the flux of radicals substantially depends on the aspect ratio of the recess feature. This results in the shadowing effect of radicals, and therefore particularly in HAR features, radical-driven deposition tends to occur at the top portions than bottom portions of the recess. On the other hand, the ions, which may also serve as the deposition precursors, have charges, thus they may be provided with kinetic energy via an electric field (e.g., bias power) and become anisotropic. The inventors of this application identified applying plasma conditions to increase the ion density may provide additional flux of deposition precursors to the bottom portions of the recess, improving the topographic selectivity of deposition and avoid clogging. Further, the plasma parameters may be selected to make the ions with larger molecular fragments such that the polymerization on surface may be more likely to occur. In other words, the gas precursors may be less fragmented, for example, where the ratio of bulky $C_xF_yHz$ species relative to fragmented F species is between 2 and 10. In addition, the ion bombardment on surface may also induce surface modification (e.g., forming dangling bonds on surface) and create active sites for polymerization, improving the rate of surface polymerization.

In contrast, for the trim phase of the topographic selective deposition, the plasma parameters may be selected (e.g., high source power) to reduce the ion density or make the ions with smaller molecular fragments, including elemental species such as fluorine atoms (i.e., F species), such that the polymerization on surface may be less likely to occur. In one embodiment, the ratio of the F species relative to the bulky $C_xF_yHz$ species is between 2 and 10. In various embodiments, some ions and radical species may be energetic enough to be etchant species and cause etching of a material, enabling the trim phase (e.g., FIG. 1C). The more isotropic nature of the radicals can advantageously make the etching by the radical-based etchant species isotropic and improve the topographic selectivity of deposition by removing more materials from the undesired surfaces (e.g., sidewalls of recess).

Figure 4A:
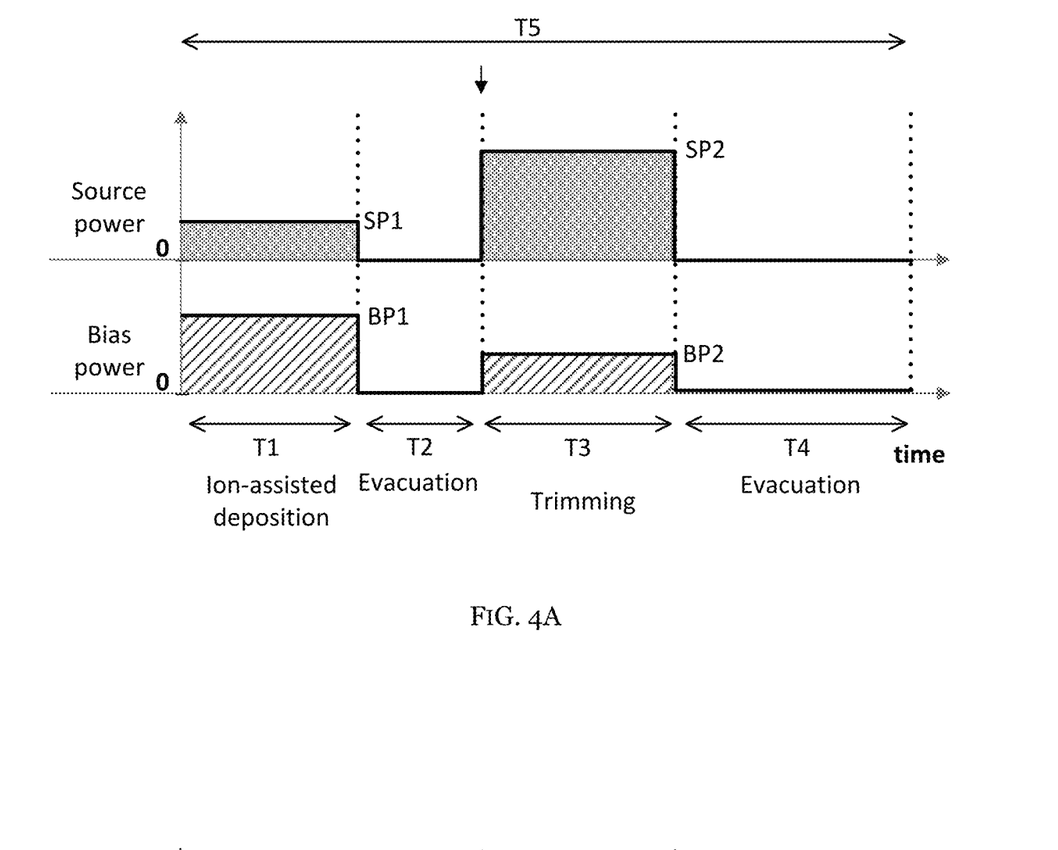
Figure 4B:
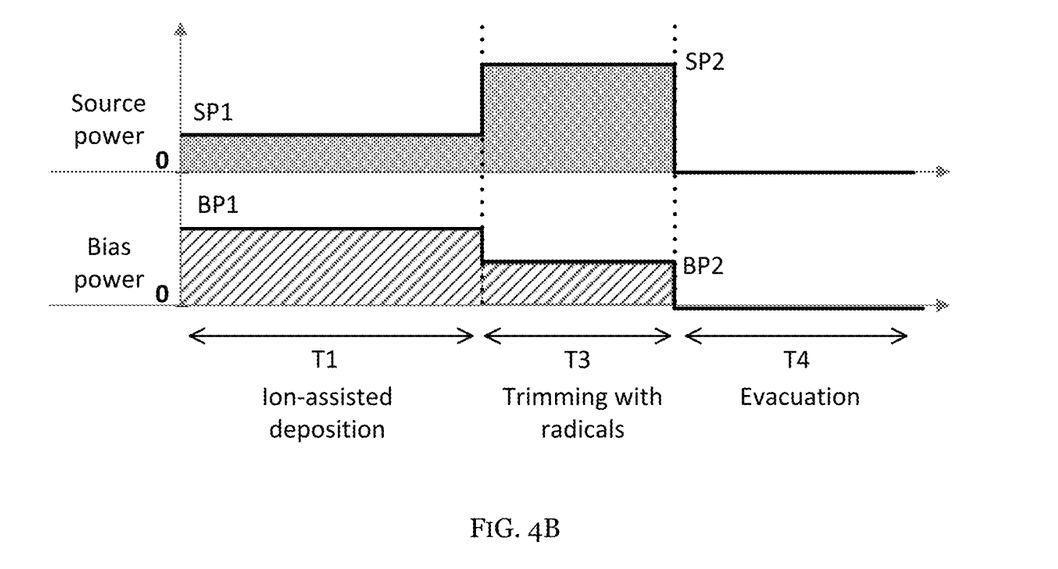

FIGS. 4A-4B illustrate timing diagrams of plasma pulsing for ion-assisted topographic selective deposition in accordance with various embodiments. FIG. 4A illustrates an embodiment with four phases and FIG. 4B illustrates another embodiment with three phases.

FIG. 4A illustrates a timing diagram for four phases of a time-multiplexed implementation of the pulsed plasma process. The horizontal axes in FIG. 4A represent progression in time. The four time intervals, T1 (ion-assisted deposition), T2 (evacuation), T3 (trimming), and T4 (evacuation) are schematically shown by the four double arrows adjacent to one time axis. Another time interval T5 represents one pulse duration that is the sum of the four time intervals T1-T4. Four vertical dotted lines intersecting the time axes demarcate the non-overlapping time intervals, T1, T2, T3, and T4. Two process parameters, source power (SP) and bias power (BP) are plotted in FIG. 4A.

During the time interval, T1, the source power and bias power may be set at a first source power level (SP1) and a first bias power level (BP1), respectively. The power levels may be selected to enable ion-assisted deposition. In various embodiments, a relatively low SP and a moderate BP may be used. For example, in one embodiment, the SP1 may be between 50 W and 500 W and the BP1 may be between 50 W and 100 W. The BP1 may be selected to maintain the ion energy in a moderate level (e.g., 50-100 eV). Such settings may be beneficial in (i) increasing ion density and (ii) generating ions with relatively larger molecular fragments (heavier species with lower degree of dissociation). These conditions may benefit the polymerization on horizontal surfaces through providing improved influx of deposition precursors as well as surface modification to form active sites for polymerization.

After the ion-assisted deposition (T1), both the SP and BP may be turned off for an evacuation phase (T2) during which process by-products may be removed from the substrate. In certain embodiments, the evacuation phase (T2) may be optional. In one or more embodiments, the evacuation phase (T2) may be performed with a certain level of SP or BP. The evacuation phase may be beneficial in controlling the thickness and profile of the deposition layer (e.g., the carbonaceous layer 130 in FIGS. 1B-1D).

Next, the trim phase (T3) may be initiated by setting the SP and BP at a second SP level (SP2) and a second BP level (BP2), respectively. The power levels may be selected to increase the radical density and enable trimming. In various embodiments, a relatively high SP and a low BP may be used. In one embodiment, the SP2 may be between 500 W and 2000 W and the BP2 may be less than 50 W, for example, between 10 W and 40 W. The BP2 may be selected to maintain the ion energy in a low level (e.g., <30 eV). Such settings may be beneficial in generating fluorine radicals, which may enable trimming of the carbonaceous layer deposited during T1. The low BP also may help controlling the thickness of the carbonaceous layer. In certain embodiments, as illustrated in FIG. 4A, the SP2 is higher than the SP1, and the BP2 is lower than the BP1. In one embodiment, the SP2 is at least twice the SP1 and the BP1 is at least twice the BP1. In another embodiment, the SP2 is 2-10 times higher than the SP1.

After the trim phase (T3), another evacuation phase (T4) may be enabled by turning off the SP and BP. In certain embodiments, this evacuation phase (T4) may also be optional. In one or more embodiments, the evacuation phase (T4) may be performed with a certain level of SP or BP.

In various embodiments, the pulsed plasma process (T1-T4) may be performed at a moderate to high pressure, for example, between 50 mTorr and 100 mTorr in one embodiment. Such pressure conditions may induce recombination of plasma species and thus generating ions with relatively larger molecular fragments and improve the deposition.

The timing diagram in FIG. 4A is for one pulse duration, and the pulsed plasma process may comprise any number of pulses. Although FIG. 4A illustrates a pulse pattern, in various embodiments, the pulsed plasma process may have varying conditions of process parameters or time intervals different from the first pulse duration. In various embodiments, the pulse cycles may be repeated at a frequency between 100 Hz and 1 kHz, and thus the pulse duration T5 may be between 1 ms and 10 ms.

In various embodiments, the duration of time intervals T1, T2, T3, and T4 may be independently determined in accordance with the respective process recipe. In certain embodiments, the ion-assisted deposition (T1) or the trim phase (T3) may be 10-50% of the pulse duration (T5). In alternate embodiments, one or the sum of the evacuation phases (T2 and T4) may be 0-80% of the pulse duration (T5).

Although not specifically described in FIG. 4A, any other process parameters such as process pressure, gas flow rates, temperature may be controlled independently at each phase of the pulsed plasma process in accordance with the respective process recipe. In various embodiments, the substrate is kept at a temperature between 5° C. and 120° C.

Further, it should be noted that the plots in FIG. 4A are for illustrative purposes only. For example, the plots show the process parameters to be changing as step functions, although the SP and BP may be modulated differently, for example, with a wave function. In another embodiment, any of the time intervals (T1, T2, T3, or T4) may comprise sub-set of power level settings.

Although FIG. 4A illustrates the ion-assisted deposition (T1) as the first phase of the pulse pattern, in other embodiments, the pulse pattern may start with another phase, for example, T3 as indicated an arrow, and the process may follow the repeating sequence of T3, T4, T1, and T2.

FIG. 4B illustrates another timing diagram with three phases in accordance with another embodiment. In FIG. 4B, the evacuation phase between T1 and T3 is skipped and the settings for SP and BP may be changed from the SP1 to the SP2 and from the BP1 to the BP2 directly. In yet another embodiment, although not illustrated, the second evacuation phase (T4) after the trim phase (T3) may also be skipped and one or more pulse durations of the pulsed plasma process may only consist of T1 and T3.

Figure 5A:
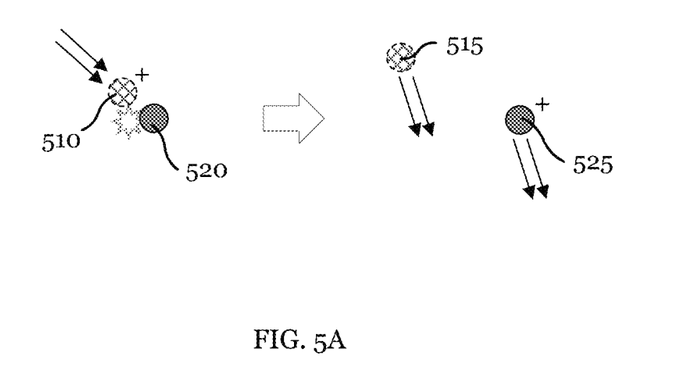
Figure 5B:
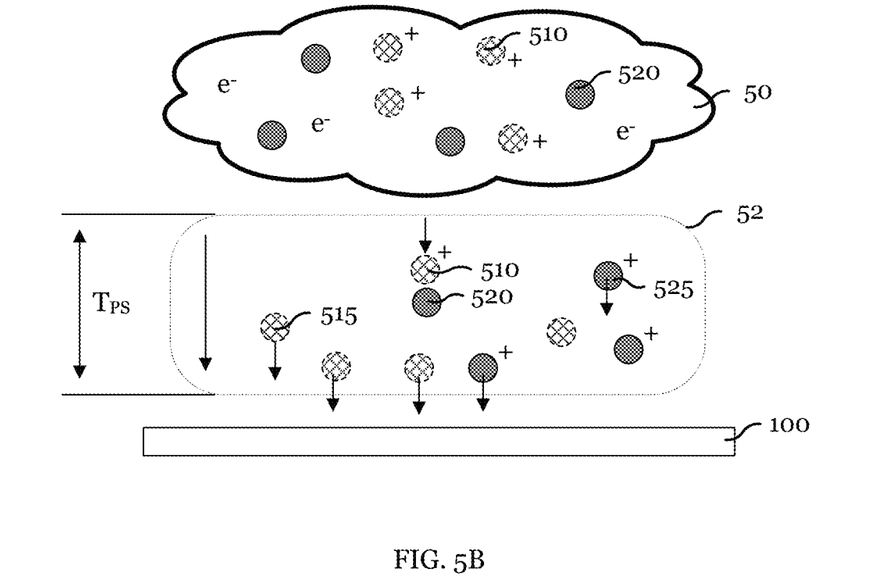

FIGS. 5A-5B illustrate topographic selective deposition driven by fast neutral species in accordance with another embodiment. FIG. 5A illustrates formation of the fast neutral species and FIG. 5B illustrates a plasma sheath comprising the fast neutral species.

In various embodiments, in addition to, or in place of, the ion-assisted deposition, the topographic selective deposition may also be enabled by fast neutral species. In FIG. 5A, a simple schematic for the formation of the fast neutral species via charge exchange mechanism is illustrated. Similar to the prior embodiments, a plasma may comprise ions 510 and radicals 520. The ions 510, due to their charges, may be provided with kinetic energy via an electric field, for example, a bias in a plasma sheath region. Arrows in FIG. 5A indicate this acceleration of the ions 510. With acceleration, the ions 510 may travel fast in the plasma sheath and with a certain probability, they may collide with other species that are relatively stationary such as the radicals 520. Upon the collision, the charge exchange may occur, resulting in fast neutral species 515 derived from the ions 510 and exchanged ions 525 derived from the radicals 520 as illustrated in FIG. 5A. Although not wishing to be limited by any theory, the resulting fast neutral species 515 can travel through the plasma sheath with the same energy or minimal energy loss, maintaining the initial directionality of the ions 510. Consequently, this fast neutral species 515 may function as the deposition precursor and the directionality may enable the anisotropy of the deposition. Further, the exchanged ions 525, due to their newly given charges, may be accelerated by the electric field, which may then induce a cascade of charge exchange collisions. Such a cascade of collisions can increase the flux of deposition precursors (e.g., fast neutrals species and ions) to the bottom of the recess.

In FIG. 5B, an example plasma sheath 52 of a plasma 50 is illustrated. The plasma 50 comprises ions 510, radicals 520, and free electrons. It should be noted that the number of each of these species is selected only for illustration purpose and does not represent their actual density/population. When the ions 510 and the radicals 520 enter the plasma sheath 52, in the presence of bias, the ions 510 may be accelerated towards a substrate 100. In the ion-assisted deposition, the topographic selective deposition may be primarily driven by the ions 510. In contrast, in the fast neutral-assisted deposition, the charge exchange from collisions described above referring to FIG. 5A occurs to generate fast neutrals species 515 and exchanged ions 525 in the plasma sheath 52. Both of these species have some directionality, as indicated by arrows in FIG. 5B, and thereby contribute to the anisotropic nature of the topographic selective deposition over the substrate 100. The bombardment of these species may also have an effect of forming active sites for adsorption of the deposition precursors.

To maximize the flux of the fast neutral species 515 and the exchanged ions 525, it may be advantageous to increase the ion density of the plasma 50 and maximize the probability of collisions for charge exchange. Because the probability of the collisions depends on a plasma sheath thickness ($T_{PS}$), in various embodiments, the plasma parameters may be adjusted for realizing a thick $T_{PS}$. This may be achieved by plasma pulsing schemes comprising ion formation and charge exchange during afterglow as further described below referring to FIGS. 6A-6B.

Figure 6A:
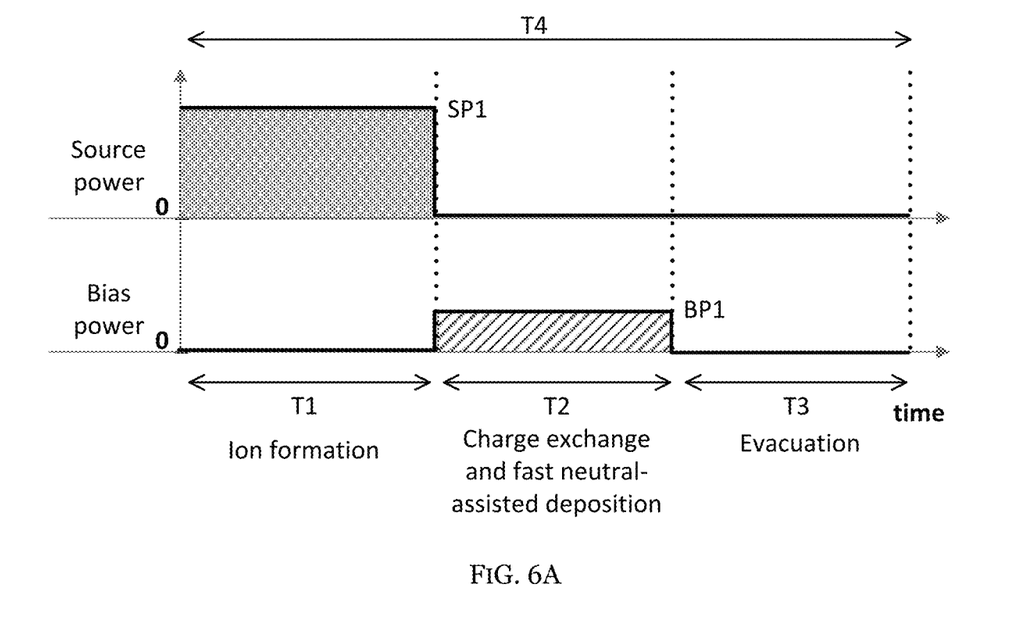
Figure 6B:
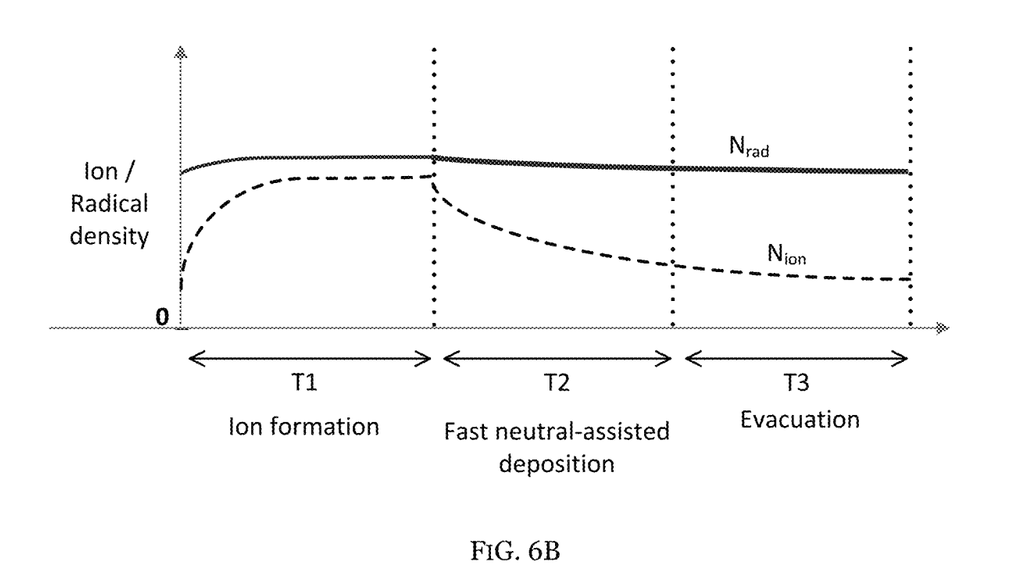
Figure 7A:
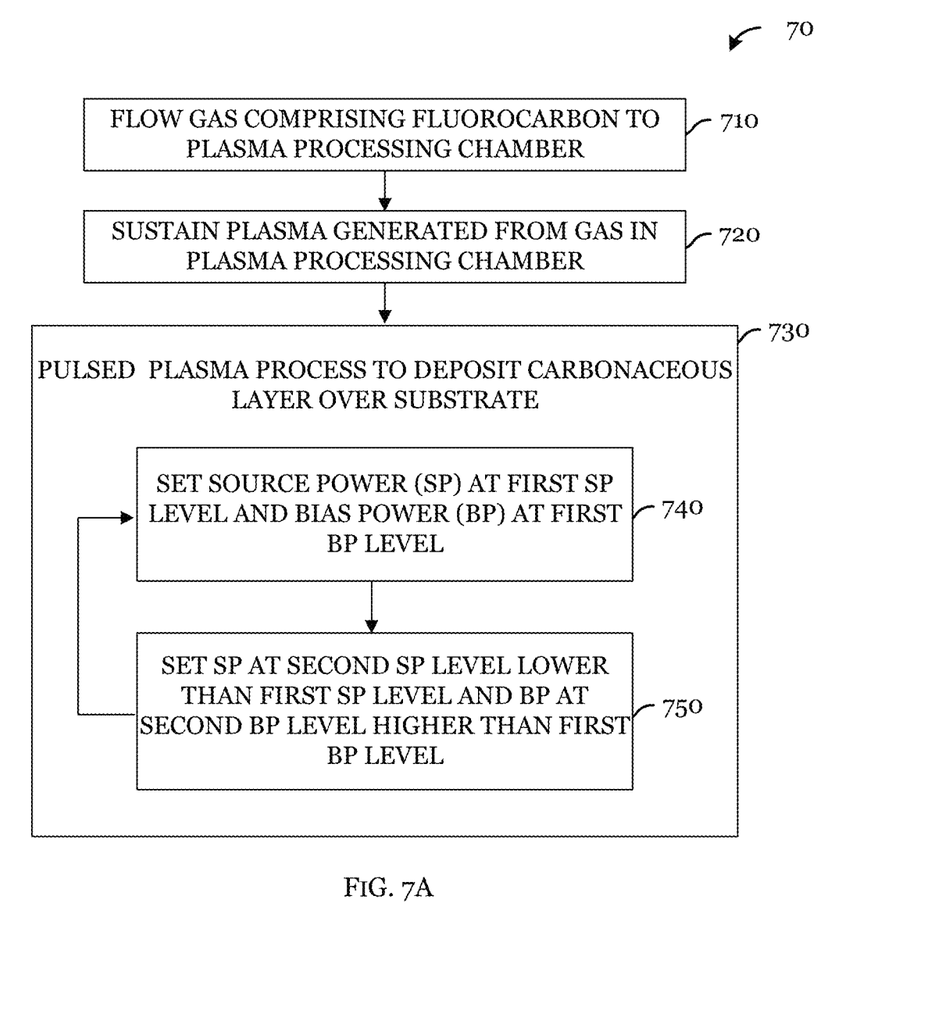
Figure 7B:
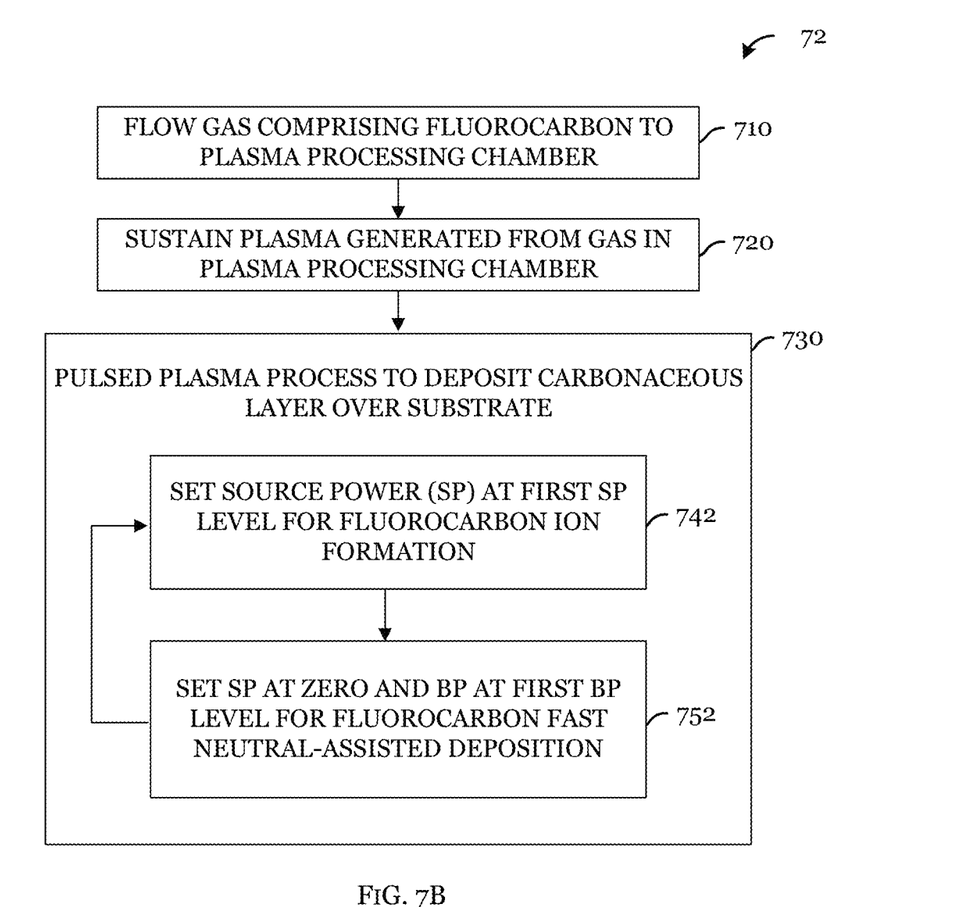
Figure 7C:
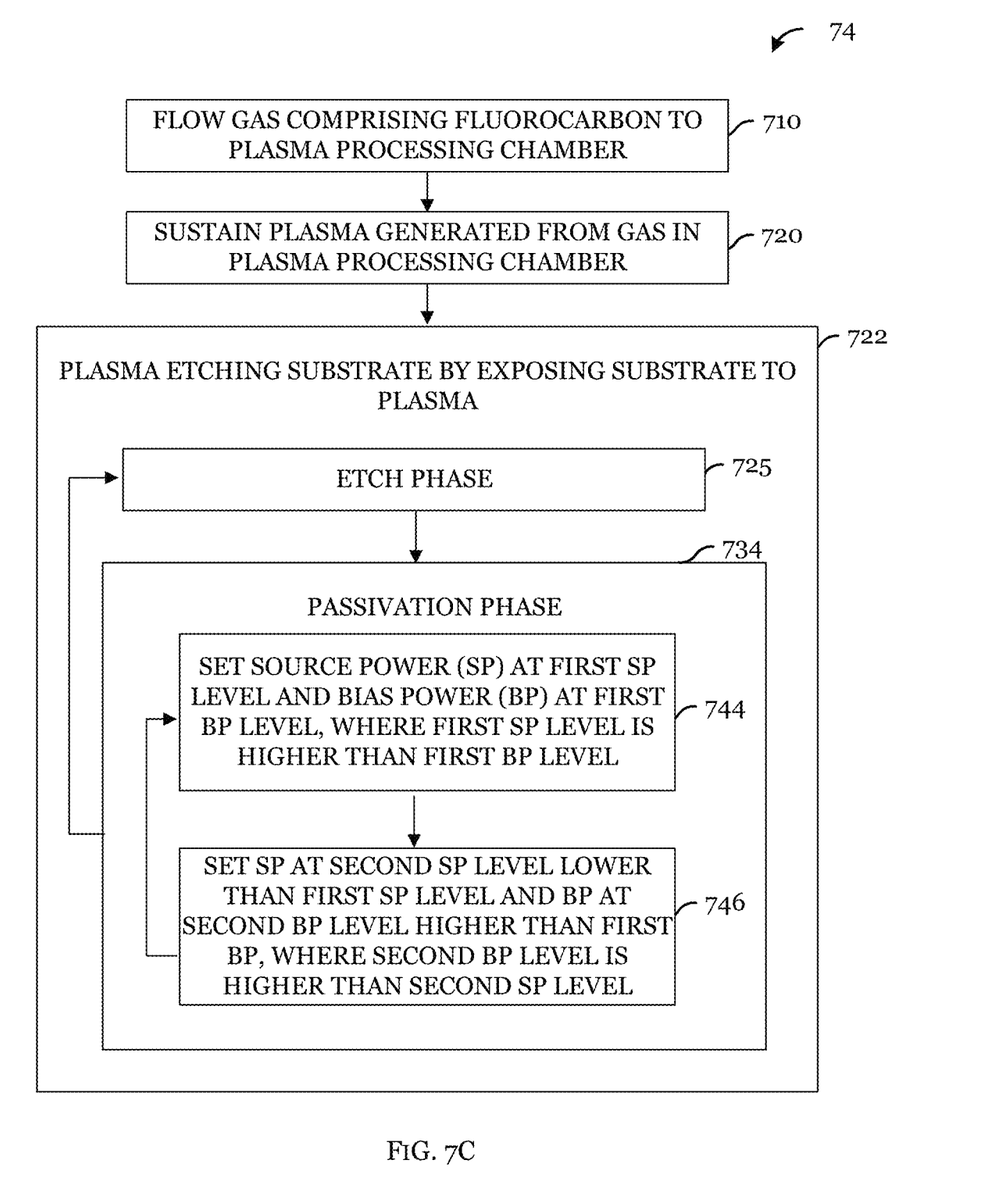

FIGS. 6A-6B illustrate fast neutral-assisted topographic selective deposition in accordance with various embodiments. FIG. 6A illustrates a timing diagram of plasma pulsing and FIG. 6B illustrates profiles of ion and radical density corresponding to the timing diagram in FIG. 6A.

FIG. 6A illustrates a timing diagram for three phases of a time-multiplexed implementation of the pulsed plasma process. The three time intervals, T1 (ion formation), T2 (charge exchange and fast neutral-assisted deposition), and T3 (evacuation) are schematically shown by the three double arrows adjacent to one time axis. Another time interval T4 represents one pulse duration that is the sum of the three time intervals T1-T3. Two process parameters, source power (SP) and bias power (BP) are plotted in FIG. 6A.

During the time interval, T1, the source power and bias power may be set at a first source power level (SP1) without applying any bias power to a substrate chuck. In certain embodiments, a bias power source may be set to zero relative to the ground potential or a reference potential. In one or more embodiments, the substrate chuck may be grounded or electrically floated. The source power levels may be selected to enable sufficient ion formation in the plasma. In various embodiments, a relatively low SP and a moderate BP may be used. For example, in one embodiment, the SP1 may be between 1 W and 2000 W. During this time interval, ions and radicals may reach to a sufficient level of density for a subsequent deposition phase (FIG. 6B).

At the end of the ion formation (T1), the source power may be turned off and in this afterglow period, a bias power may be applied to the substrate chuck at a first bias power level (BP1). In various embodiments, a low to moderate BP may be used. For example, in one embodiment, the BP1 may be between 10 W and 100 W, and in another embodiment between 50 W and 80 W. Such settings may be beneficial in maximizing the plasma sheath thickness ($T_{PS}$) and thereby the probability of charge exchange without causing etching. In various embodiments, a moderate ion energy level (<50 eV) may be maintained. Under these conditions, the plasma ion density may remain high (FIG. 6B), and the applied bias may advantageously help accelerating the ions into the plasma sheath and inducing charge exchange. In certain embodiments, the SP1 is higher than the BP1. In one embodiment, the SP1 is at least twice the BP1.

After the T2, both the SP and BP may be turned off for an evacuation phase (T3) during which process by-products may be removed from the substrate. In certain embodiments, the evacuation phase (T3) may be optional. In one or more embodiments, the evacuation phase (T3) may be performed with a certain level of SP or BP.

In various embodiments, the pulsed plasma process (T1-T3) may be performed at a low to moderate pressure, for example, between 1 mTorr and 100 mTorr in one embodiment, and 1 mTorr and 50 mTorr in another embodiment. Such pressure conditions may help preventing loss of directionality of the fast neutrals due to further collisions in the plasma sheath with other neutrals.

Operating in a pulsed plasma for the topographic selective deposition may advantageously allow for higher density of larger deposition precursor species by recombination during the afterglow period (e.g., T2) in comparison to a continuous plasma.

FIGS. 7A-7C illustrate process flow charts of methods of topographic selective deposition in accordance with various embodiments. The process flow can be followed with the figures (FIGS. 1A-1D, 2A-2D, 4A-4B and 6A) discussed above and hence will not be described again.

In FIG. 7A, a process flow 70 starts with flowing a gas comprising a fluorocarbon to a plasma processing chamber (block 710), followed by sustaining a plasma generated from the gas in the plasma processing chamber (block 720). Next, a pulsed plasma process may be performed to deposit a carbonaceous layer over the substrate (block 730, FIGS. 1B-1D) The substrate comprises top and bottom surfaces, where the bottom surface being at a bottom of a recess of the substrate, the recess has an aspect ratio between 10:1 and 100:1, the carbonaceous layer is deposited on the bottom surface. The pulsed plasma process may comprise during a first time duration, setting a source power (SP) at a first SP level and a bias power (BP) at a first BP level, where the plasma during the first time duration comprises fluorocarbon ions that polymerize on the bottom surface to form the carbonaceous layer (block 740, FIG. 1B), and during a second time duration, setting the SP at a second SP level higher than the first SP level and the BP at a second BP level lower than the first BP level, where the plasma during the second time duration comprises fluorine radicals that trim the carbonaceous layer (block 750, FIG. 1C).

In FIG. 7B, a process flow 72 starts with flowing a gas comprising a fluorocarbon to a plasma processing chamber (block 710), followed by sustaining a plasma generated from the gas in the plasma processing chamber (block 720). Next, a pulsed plasma process may be performed to deposit a carbonaceous layer over the substrate (block 730, FIGS. 1B-1D) The substrate comprises top and bottom surfaces, where the bottom surface being at a bottom of a recess of the substrate, the recess has an aspect ratio between 10:1 and 100:1, the carbonaceous layer is deposited on the bottom surface. The pulsed plasma process may comprise during a first time duration, setting a source power (SP) at a first SP level (block 742), and during a second time duration, setting the SP at zero and the BP at a first BP level, where the plasma during the second time duration comprises fluorocarbon ions and radical species, the fluorocarbon ions are accelerated in a sheath of the plasma and colliding with radical species, the colliding causes charge exchange between the fluorocarbon ions and the radical species and forms fluorocarbon fast neutral species from the fluorocarbon ions, and the fluorocarbon fast neutral species polymerize on the bottom surface to form the carbonaceous layer (block 752, FIG. 1B).

In FIG. 7C, a process flow 74 starts with flowing a gas comprising a fluorocarbon to a plasma processing chamber (block 710), followed by sustaining a plasma generated from the gas in the plasma processing chamber (block 720). Next, a pulsed plasma etch process may be performed to form a recess having an aspect ratio between 10:1 and 100:1 using a patterned etch mask disposed over the substrate (block 722, FIGS. 2A-2D). A pulse pattern of the pulsed plasma etch process may comprise an etch phase and a passivation phase (blocks 725 and 734, FIGS. 2B-2D). The passivation phase may comprise, during a first time duration, setting a source power (SP) at a first SP level and a bias power (BP) at a first BP level, the first SP level being higher than the first BP level (block 744), and during a second time duration, setting the SP at a second SP level lower than the first SP level and the BP at a second BP level higher than the first BP level, the second BP level being higher than the second SP level (block 746).

Example embodiments of the invention are summarized here. Other embodiments can also be understood from the entirety of the specification as well as the claims filed herein.

Example 1. A method of processing a substrate that includes: flowing a gas including a fluorocarbon to a plasma processing chamber; sustaining a plasma generated from the gas in the plasma processing chamber; depositing a carbonaceous layer over the substrate by exposing the substrate to the plasma, the substrate including top and bottom surfaces, the bottom surface being at a bottom of a recess of the substrate, the recess having an aspect ratio between 10:1 and 100:1, the carbonaceous layer being deposited on the bottom surface, the depositing including a pulsed plasma process including a plurality of pulse cycles, each pulse cycle of the pulsed plasma process including: during a first time duration, setting a source power (SP) at a first SP level and a bias power (BP) at a first BP level, where the plasma during the first time includes fluorocarbon ions, the fluorocarbon ions polymerizing on the bottom surface to form the carbonaceous layer, and during a second time duration, setting the SP at a second SP level higher than the first SP level and the BP at a second BP level lower than the first BP level, where the plasma during the second time duration includes fluorine radicals, the fluorine radicals trimming the carbonaceous layer.

Example 2. The method of example 1, where the pulsed plasma process further includes maintaining a chamber pressure of the plasma processing chamber between 50 mTorr and 100 mTorr.

Example 3. The method of one of examples 1 or 2, where the plurality of pulse cycles is repeated at a frequency between 100 Hz and 1 kHz.

Example 4. The method of one of examples 1 to 3, where the first SP level is between 100 W and 400 W and the second SP level is between 350 W and 650 W.

Example 5. The method of one of examples 1 to 4, where the first BP level is between 50 W and 100 W and the second BP level is between 10 W and 40 W.

Example 6. The method of one of examples 1 to 5, where one pulse cycle of the pulsed plasma process further includes, between the first and second time durations, turning off the SP and BP for a third time duration.

Example 7. The method of one of examples 1 to 6, where one pulse cycle of the pulsed plasma process further includes, after the second time duration, turning off the SP and BP for a fourth time duration.

Example 8. The method of one of examples 1 to 7, where the carbonaceous layer is deposited on both the top and bottom surfaces during the first time duration.

Example 9. The method of one of examples 1 to 8, where the carbonaceous layer is deposited on sidewalls of the recess at a deposition rate slower than those on the top and bottom surfaces.

Example 10. The method of one of examples 1 to 9, where trimming the carbonaceous layer removes the carbonaceous layer from the sidewalls.

Example 11. A method of processing a substrate that includes: flowing a gas including a fluorocarbon to a plasma processing chamber; sustaining a plasma generated from the gas in the plasma processing chamber; depositing a carbonaceous layer over the substrate by exposing the substrate to the plasma, the substrate including top and bottom surfaces, the bottom surface being at a bottom of a recess of the substrate, the recess having an aspect ratio between 10:1 and 100:1, the carbonaceous layer being deposited on the bottom surface, the depositing including performing a pulsed plasma process with a pulse pattern, the pulse pattern including: during a plasma-on phase, setting a source power (SP) at a first SP level, and during an afterglow phase, setting the SP at zero relative to ground potential and a bias power (BP) at a first BP level, where the first SP level is selected to produce fluorocarbon ions and radical species, where the first BP level is selected to increase a thickness of a plasma sheath of the plasma during the afterglow phase relative to that during the plasma-on phase, and cause collisions and charge exchange between the fluorocarbon ions and radical species to form fast neutrals species from the fluorocarbon ions, the fast neutrals species polymerizing on the bottom surface to form the carbonaceous layer.

Example 12. The method of example 11, further including, during the plasma-on phase, setting the BP at zero relative to the ground potential.

Example 13. The method of one of examples 11 or 12, where the pulsed plasma process further includes maintaining a chamber pressure of the plasma processing chamber between 1 mTorr and 50 mTorr.

Example 14. The method of one of examples 11 to 13, where the pulse pattern has a frequency between 100 Hz and 1 kHz.

Example 15. The method of one of examples 11 to 14, where the first BP level is between 10 W and 100 W.

Example 16. The method of one of examples 11 to 15, where the pulse pattern further includes, after the afterglow phase, turning off the SP and BP for a third time duration.

Example 17. A method of processing a substrate that includes: flowing a gas including a fluorocarbon to a plasma processing chamber; sustaining a plasma generated from the gas in the plasma processing chamber; and etching the substrate to form a recess having an aspect ratio between 10:1 and 100:1 using a patterned etch mask disposed over the substrate, the etching including exposing the substrate to the plasma, the exposing including cyclically repeating an etch phase and a passivation phase, where, during the passivation phase, a carbonaceous layer is deposited over a top surface of the patterned etch mask, and where the passivation phase includes during a first time duration, setting a source power (SP) at a first SP level and a bias power (BP) at a first BP level, the first SP level being higher than the first BP level, and during a second time duration, setting the SP at a second SP level lower than the first SP level and the BP at a second BP level higher than the first BP level, the second BP level being higher than the second SP level.

Example 18. The method of example 17, where the first BP level or the second SP level is zero relative to ground potential, and where the second BP level is selected to generate fluorocarbon fast neutral species from fluorocarbon ions, the fluorocarbon fast neutral species polymerizing on the top surface of the patterned etch mask to form the carbonaceous layer.

Example 19. The method of one of examples 17 or 18, where the first SP level and the first BP level are selected to form fluorine radicals in the plasma, the fluorine radicals trimming the carbonaceous layer.

Example 20. The method of one of examples 17 to 19, where the second SP level and the second BP level are selected to form fluorocarbon ions in the plasma, the fluorocarbon ions polymerizing on the top surface of the patterned etch mask to form the carbonaceous layer.

Example 21. The method of one of examples 17 to 20, where the etching further comprises, during the passivation phase, maintaining a chamber pressure of the plasma processing chamber between 10 mTorr and 100 mTorr.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of processing a substrate, the method comprising:
   flowing a gas comprising a fluorocarbon to a plasma processing chamber;
   sustaining a plasma generated from the gas in the plasma processing chamber; and
   depositing a carbonaceous layer over the substrate by exposing the substrate to the plasma, the substrate comprising top and bottom surfaces, the bottom surface being at a bottom of a recess of the substrate, the recess having an aspect ratio between 10:1 and 100:1, the carbonaceous layer being deposited on the bottom surface, the depositing comprising a pulsed plasma process comprising a plurality of pulse cycles, each pulse cycle of the pulsed plasma process comprising:
   during a first time duration, setting a source power (SP) at a first SP level and a bias power (BP) at a first BP level, wherein the plasma during the first time duration comprises fluorocarbon ions, the fluorocarbon ions polymerizing on the bottom surface to form the carbonaceous layer, and
   during a second time duration, setting the SP at a second SP level higher than the first SP level and the BP at a second BP level lower than the first BP level, wherein the plasma during the second time duration comprises fluorine radicals, the fluorine radicals trimming the carbonaceous layer.

2. The method of claim 1, wherein the pulsed plasma process further comprises maintaining a chamber pressure of the plasma processing chamber between 50 mTorr and 100 mTorr.

3. The method of claim 1, wherein the plurality of pulse cycles is repeated at a frequency between 100 Hz and 1 kHz.

4. The method of claim 1, wherein the first SP level is between 100 W and 400 W and the second SP level is between 350 W and 650 W.

5. The method of claim 1, wherein the first BP level is between 50 W and 100 W and the second BP level is between 10 W and 40 W.

6. The method of claim 1, wherein one pulse cycle of the pulsed plasma process further comprises, between the first and second time durations, turning off the SP and BP for a third time duration.

7. The method of claim 1, wherein one pulse cycle of the pulsed plasma process further comprises, after the second time duration, turning off the SP and BP for a fourth time duration.

8. The method of claim 1, wherein the carbonaceous layer is deposited on both the top and bottom surfaces during the first time duration.

9. The method of claim 8, wherein the carbonaceous layer is deposited on sidewalls of the recess at a deposition rate slower than those on the top and bottom surfaces.

10. The method of claim 9, wherein trimming the carbonaceous layer removes the carbonaceous layer from the sidewalls.

11. A method of processing a substrate, the method comprising:
   flowing a gas comprising a fluorocarbon to a plasma processing chamber;
   sustaining a plasma generated from the gas in the plasma processing chamber;
   depositing a carbonaceous layer over the substrate by exposing the substrate to the plasma, the substrate comprising top and bottom surfaces, the bottom surface being at a bottom of a recess of the substrate, the recess having an aspect ratio between 10:1 and 100:1, the carbonaceous layer being deposited on the bottom surface, the depositing comprising performing a pulsed plasma process with a pulse pattern, the pulse pattern comprising:
   during a plasma-on phase, setting a source power (SP) at a first SP level, and
   during an afterglow phase, setting the SP at zero relative to ground potential and a bias power (BP) at a first BP level,
   wherein the first SP level is selected to produce fluorocarbon ions and radical species,
   wherein the first BP level is selected to
   increase a thickness of a plasma sheath of the plasma during the afterglow phase relative to that during the plasma-on phase, and
   cause collisions and charge exchange between the fluorocarbon ions and radical species to form fast neutrals species from the fluorocarbon ions, the fast neutrals species polymerizing on the bottom surface to form the carbonaceous layer.

12. The method of claim 11, further comprising, during the plasma-on phase, setting the BP at zero relative to the ground potential.

13. The method of claim 11, wherein the pulsed plasma process further comprises maintaining a chamber pressure of the plasma processing chamber between 1 mTorr and 50 mTorr.

14. The method of claim 11, wherein the pulse pattern has a frequency between 100 Hz and 1 kHz.

15. The method of claim 11, wherein the first BP level is between 10 W and 100 W.

16. The method of claim 11, wherein the pulse pattern further comprises, after the afterglow phase, turning off the SP and BP for a third time duration.

17. A method of processing a substrate, the method comprising:
   flowing a gas comprising a fluorocarbon to a plasma processing chamber;
   sustaining a plasma generated from the gas in the plasma processing chamber; and
   etching the substrate to form a recess having an aspect ratio between 10:1 and 100:1 using a patterned etch mask disposed over the substrate, the etching comprising exposing the substrate to the plasma, the exposing comprising cyclically repeating an etch phase and a passivation phase,
   wherein, during the passivation phase, a carbonaceous layer is deposited over a top surface of the patterned etch mask, and wherein the passivation phase comprises
during a first time duration, setting a source power (SP) at a first SP level and a bias power (BP) at a first BP level, the first SP level being higher than the first BP level, and
during a second time duration, setting the SP at a second SP level lower than the first SP level and the BP at a second BP level higher than the first BP level, the second BP level being higher than the second SP level.

18. The method of claim 17, wherein the first BP level or the second SP level is zero relative to ground potential, and wherein the second BP level is selected to generate fluorocarbon fast neutral species from fluorocarbon ions, the fluorocarbon fast neutral species polymerizing on the top surface of the patterned etch mask to form the carbonaceous layer.

19. The method of claim 17, wherein the first SP level and the first BP level are selected to form fluorine radicals in the plasma, the fluorine radicals trimming the carbonaceous layer.

20. The method of claim 17, wherein the second SP level and the second BP level are selected to form fluorocarbon ions in the plasma, the fluorocarbon ions polymerizing on the top surface of the patterned etch mask to form the carbonaceous layer.

* * * * *